(12) United States Patent
Yamazaki

(10) Patent No.: US 6,246,387 B1
(45) Date of Patent: Jun. 12, 2001

(54) SEMICONDUCTOR DISPLAY DEVICE

(75) Inventor: Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/233,442

(22) Filed: Jan. 20, 1999

(30) Foreign Application Priority Data

Jan. 23, 1998 (JP) .................................................. 10-026592

(51) Int. Cl.[7] .................................................... G09G 3/36
(52) U.S. Cl. .............................. 345/92; 345/98; 345/205; 345/206
(58) Field of Search ................................. 345/92, 93, 96, 345/98–99, 100, 205, 206

(56) References Cited

U.S. PATENT DOCUMENTS

| | | | |
|---|---|---|---|
| 5,844,535 | * 12/1998 | Itoh et al. | 345/92 |
| 5,900,854 | * 5/1999 | Itoh et al | 345/99 |
| 5,945,970 | * 8/1999 | Moon et al. | 345/92 |
| 5,990,877 | * 11/1999 | Yeo | 345/92 |
| 6,037,923 | * 3/2000 | Suzuki | 345/92 |
| 6,069,605 | * 5/2000 | Ozawa | 345/98 |

OTHER PUBLICATIONS

K.Yoneda et al., "A smart arrangement of TFTs in low–temperature poly–silicon circuitry for achieving higher effective yield in producton", Conference Record Of The 1997 International Display Research Conference and Inernational Workshops On LCD Technology and Emissive Technology, pp. L1–L4.

* cited by examiner

Primary Examiner—Richard A. Hjerpe
Assistant Examiner—Kimnhung Nguyen
(74) Attorney, Agent, or Firm—Eric J. Robinson; Nixon Peabody LLP

(57) ABSTRACT

An active matrix semiconductor device is provided which is free of unevenness in image. The analog switch and buffer in a drive circuit are structured by a plurality of parallel-connected analog switches and buffers each formed by a TFT with a small channel width. The carrier moving direction of these TFTs are oblique relative to a scanning direction of a linear laser used for laser crystallization. By doing so, the analog switch and the buffer are decreased in characteristic variation with deterioration suppressed. Thus an active matrix semiconductor device is realized which is free of unevenness in image.

6 Claims, 9 Drawing Sheets

SEMICONDUCTOR DISPLAY DEVICE

BACKGROUND OF THE INVENTION

1. Field of the Invention

The present invention relates to semiconductor display devices with thin film transistors. More particularly, the invention relates to a technology to manufacture a plurality of thin film transistors free of characteristic variations through the use of a linear laser beam.

2. Description of the Prior Art

In recent years studies have been eagerly made in order to decrease the process temperature in the manufacture of thin film transistors (hereinafter referred to as TFTs). The major reason for this is due to a necessity that a semiconductor device is to be formed on an insulator substrate of such as a glass that is low in cost but high in processability. The temperature decrease in the process to manufacture a semiconductor device is also demanded from a viewpoint of put forward with device scale down and multilevel structure.

The manufacture of a high performance semiconductor device requires a process to crystallize an amorphous ingredient or amorphous semiconductor material contained in a semiconductor material. Meanwhile, there might require a process to restore deteriorated crystallinity in a semiconductor material whose property is crystalline in nature but deteriorated by ion irradiation, or a process to improve crystallinity furthermore. Conventionally, thermal anneal has been utilized for such purposes. Where silicon has been employed as a semiconductor material, anneal has been conducted at temperatures of 600° C. to 1100° C. for 1 to 48 hours or longer in order to cause amorphous crystallization, crystallinity restoration, crystallinity improvement and so on.

In the thermal anneal for the above purposes, the high the process temperature the shorter the required process time becomes. However, there is almost no preferred effect at a temperatures of 500° C. or below. From a viewpoint of temperature decrease, it has been conventionally considered that the process using thermal anneal has to be substituted by another means. Particularly it has been considered that, where a glass is used as a substrate, the glass substrate has a heat resisting temperature of around 600° C. and accordingly requires such a means to be effected at a temperature below this that corresponds to the conventional thermal anneal.

In recent, attentions have been drawn to techniques attempted to irradiate laser light onto a semiconductor material in order to perform various types of anneal. The thermal anneal with laser light irradiation has an advantage that there is no necessity to exposing the entire substrate to a high temperature because of its capability to give high energy equivalent to that of thermal anneal to a desired limited point.

There are, roughly, two proposals as a method to irradiate laser light.

The first method uses a continuous oscillation laser such as an argon ion laser, in order to irradiate a spot-formed beam to a semiconductor material. This method utilizes a difference of in-beam energy distribution and beam movement to cause fusion in a semiconductor material and then moderate solidification thereby crystallizing the semiconductor material.

The second method uses a pulse oscillation laser alike an excimer laser to irradiate a great energy laser pulse to a semiconductor material, wherein upon laser irradiation the semiconductor material instantaneously fuses and solidifies thus utilizing crystal growth proceeding.

The first method involves a problem of taking a long time to perform the process. This is because the continuous oscillation laser is limited in its maximum energy and the beam spot size is at most on a order of a millimeter square. In contrast to this, the second method the laser has a great maximum energy by which a spot as large as several centimeter square or greater can be used to enhance mass productivity.

However, where using a beam in a usual square or rectangular form, there is a necessity of moving the beam in vertical and horizontal directions in order to process an entire substrate with a wide area. Thus a problem has still been left in respect of productivity (throughput).

To cope with this, the throughput can be largely improved by adopting a method wherein the beam shape is changed into a linear form having a beam width greater than that of a substrate to be processed in order to implement scanning the beam over the substrate relative thereto. The scan herein refers to linear laser irradiation with slightly shifting while overlapping.

However, where applying the above technique using linear pulse laser irradiation with overlap while slight shifting, linear fringes naturally occur on a surface of a laser-irradiated semiconductor material. These fringes has a great adverse effect upon characteristics of a device having been formed or to be formed on the surface of the semiconductor material. In particular, a serious problem will be encountered when a plurality of devices are to be formed on the substrate with an even characteristic on a one-by-one device basis. In such a case, the fringe pattern has variation in characteristic occurring between the fringes despite each fringe is homogeneous in characteristic.

In also the anneal method using a linear laser light, a problem rises in respect of evenness by the effect of irradiation. High evenness herein refers to the ability to provide an even device characteristic regardless of a device forming position on the substrate. The improvement in evenness means to make homogeneous the crystallinity of a semiconductor material. The following attempts have being made in order to raise the evenness.

It is known that the evenness is improved by preparatorily irradiating (hereinafter referred to as preparatory irradiation) a pulse laser light with a weaker intensity prior to irradiating a stronger pulse laser light (hereinafter referred to as main irradiation) in order to relax unevenness due to laser irradiation effects. This is extremely effective and improve a semiconductor device circuit characteristic to a significant extent with variation suppressed.

The reason why the preparatory irradiation effective for film homogeneousness is that a semiconductor material film containing an amorphous portion as stated before has such a property of laser energy absorption ratio that is significantly different from that of a polysilicon film or single crystal film. That is, two stage irradiation acts to crystallize, in a first irradiation, amorphous portions remained in the film and, at a second irradiation, accelerates entire crystallization. The moderate crystallization as this serves to suppress to a certain extent fringes from occurring on the semiconductor material due to linear laser irradiation. This attempt considerably improves the laser light irradiation effect and the fringes as observed become comparatively modest.

However, in the case that a multiplicity (on the order of several millions to several tens of millions) of thin film transistors are required to form on a glass substrate as in an active matrix semiconductor display device, e.g., a liquid crystal display device, even the laser irradiation method with two stage irradiation is unsatisfactory in respect of its evenness effect.

Here, a schematic configuration diagram of a conventional active matrix liquid crystal display is shown in FIG. 8. In FIG. 8, 801 is a shift register on a source signal line side, 802 and 803 are buffers (inverters), 804 is an analog switches, 805 is a video signal line, 806 is a source signal line, 807 is a shift register on a gate signal line side, 808 is a buffer (inverter), 809 is a gate signal line, 810 is a pixel TFTs and 811 is a liquid crystal. Also, FIGS. 9(a) and 9(b) demonstrate circuit diagrams for the buffers (inverters) 802, 803 and 808 and the analog switch 804.

In the buffer of FIG. 9(a), IN represents that a timing signal is inputted from the shift register while OUT denotes outputting an inverted signal thereof. Also, Vdd is a constant power voltage. In the analog switch of FIG. 9(b), IN represents inputting of a signal from the buffer while INb inputting of an inverted signal thereof. VIDEO IN is inputted with a video signal from the video signal line, and VIDEO OUT outputs a video signal therefrom.

Reference is now made to FIG. 8. The shift register 801 on the source signal line side sequentially supplies timing signals to the buffer 802. The timing signals are amplified by the buffer 802 to control the opening and closing of the analog switch 804. An image signal is introduced from the video signal line 805 through the analog switch 804, and is then supplied through the source signal line 806 to a corresponding pixel TFT 810. Based on the timing signals sequentially supplied from the shift register 807 of the gate signal line side, the buffer 808 supplies scan signals through the gate signal line 809 to a corresponding pixel TFT 810. Accordingly, a pixel TFT 810 supplied (i.e., selected by) with the scan signal and image signal supplies a voltage to the liquid crystal 811 through a pixel electrode connected to a drain region thereof, thereby driving the liquid crystal. At this time, the transmission light through the liquid crystal varies in intensity, thereby providing images.

The factor to cause deterioration particularly in image quality (unevenness in display) for the active matrix liquid crystal display device includes variation in characteristic of the analog witch or the buffer.

This is due to the fact that there encounters an inevitable increase in load capacitance of the source signal line and the gate signal line in an attempt to achieve an increase in precision and resolution for the active matrix liquid crystal display. To drive the source signal line having an increased load capacitance requires a increased capacitance of an analog switch. Moreover, the operation of an analog switch with an increased capacitance requires a buffer with an increased capacitance. Where forming analog switches or buffers having an increased capacitance by thin film transistors (TFTs), the TFTs have to be made with increased capacitance, or increased channel width. The TFTs, if great in channel width, have variation in crystallinity within the device with a result that the TFTs have variation in their threshold voltage. It is therefore natural that variation is introduced in the analog switch or analog buffer formed by a plurality of TFTs. This results in an existence of analog switches or analog buffers varied in characteristic by a source signal line. The variation in characteristic leads to variation in application voltage to the liquid crystal. This is reflected by unevenness in display entirely in the display device.

In the meanwhile, if the size (channel width) of the TFT is excessively large, the TFT at its end does not function as a channel despite it at a center functions as a channel, resulting in a possibility to accelerate deterioration.

Furthermore, where the TFT is great in size, the TFT has increased self heat generation, leading to variation in threshold value or deterioration.

This also requires increase in capacitance for the buffers to drive the gate signal line, leading to variation in characteristic, deterioration, self heat generation and so on similarly to the case of the source signal line.

Consequently, the TFT unevenness induces deterioration in image quality (unevenness in display) particularly for the active matrix liquid crystal display device, resulting in a major factor to reduce product yield.

SUMMARY OF THE INVENTION

The present invention has been made in view of the above-described problems, and it is an object to provide an active matrix semiconductor display device which prevents unevenness in display caused due to unevenness in thin film transistors thereby realizing high image quality.

In the present invention, deterioration in image quality is prevented by preventing characteristic variation in the TFTs forming analog switches and buffers that are important in respect of having direct effects upon image quality for an active matrix semiconductor display device. More specifically, the TFTs forming an analog switch or buffer are divided into a plurality of parallel-connected TFTs having a smaller channel width.

Arrangement (patterning) is made such that the direction of the TFT active layers, i.e., carrier movement, is oblique relative to a direction of scanning a linear laser (laser beam) used to crystallize the semiconductor active layers during manufacturing the TFTs, or a direction perpendicular to the longitudinal direction.

It is known that if the TFT active layers are arranged oblique with respect to the linear laser beam scan direction as stated above, the individual TFTs have a characteristic decreased in variation. This accordingly can decrease variation in characteristic of the analog switches, buffers, etc. having direct effects upon image quality.

The present invention will now be explained hereinbelow.

In accordance with one embodiment, there is provided a semiconductor display device having a pixel matrix circuit, a source signal line drive circuit, and a gate signal line drive circuit, the semiconductor display device comprising: the source signal line drive circuit having a buffer and an analog switch directly connected to a source signal line, the buffer being formed by buffers in number of x (x is an integer greater than 2) connected in parallel, the analog switch being formed by analog switches in number y (y is an integer greater than 2); the gate signal line drive circuit having a buffer directly connected to a gate signal line, the buffer being formed by buffers in number z (z is an integer greater than 2) connected in parallel; the pixel matrix circuit, the source signal line drive circuit, and the gate signal line drive circuit being formed by a plurality of TFTs using silicon films; the silicon films being crystallized by scanning a linear laser; and the plurality of TFTs forming the analog switch and the buffer has a carrier moving direction oblique relative to a scanning direction of the linear laser. This achieves the above-described object.

The carrier moving direction of the TFTs may be approximately at 45 degrees with respect to the linear laser scanning direction.

In accordance with another embodiment, there is provided a semiconductor display device having a pixel matrix circuit, a source signal line drive circuit, and a gate signal line drive circuit, the semiconductor display device comprising: the source signal line drive circuit having an analog switch directly connected to a source signal line, the analog switch being formed by analog switches in number y (y is an integer greater than 2); the gate signal line drive circuit having a buffer directly connected to a gate signal line, the buffer being formed by buffers in number z (z is an integer greater than 2) connected in parallel; the pixel matrix circuit, the source signal line drive circuit, and the gate signal line drive circuit being formed by a plurality of TFTs using silicon films; the silicon films being crystallized by scanning a linear laser; and the plurality of TFTs forming the analog switch and the buffer has a carrier moving direction oblique relative to a scanning direction of the linear laser. This achieves the above-described object.

The carrier moving direction of the TFTs may be approximately at 45 degrees with respect to the linear laser scanning direction.

In accordance with still another embodiment, a semiconductor display device having a pixel matrix circuit, a source signal line drive circuit, and a gate signal line drive circuit, the semiconductor display device comprising: the source signal line drive circuit having a buffer and an analog switch directly connected to a source signal line, the buffer being formed by buffers in number of x (x is an integer greater than 2) connected in parallel, the analog switch being formed by analog switches in number y (y is an integer greater than 2); the gate signal line drive circuit having a buffer directly connected to a gate signal line, the buffer being formed by buffers in number z (z is an integer greater than 2) connected in parallel; the pixel matrix circuit, the source signal line drive circuit, and the gate signal line drive circuit being formed by a plurality of TFTs using silicon films; and the plurality of TFTs forming the analog switch and the buffer has a carrier moving direction oblique relative to a row direction and column direction of the pixel matrix circuit. This achieves the above-described object.

The carrier moving direction of the TFTs may be approximately at 45 degrees with respect to the row direction and column direction of the pixel matrix circuit.

DETAILED DESCRIPTION OF THE PREFERRED EMBODIMENTS

Now the present invention will be explained in detail based on embodiments as described below. It should be noted that the embodiments are mere certain embodied forms of the invention and the present invention is not limited to those forms.

EMBODIMENT 1

In the present embodiment, an active matrix liquid crystal display device is explained which has an analog switch directly connected to a source signal line, a last staged buffer for controlling the analog switch, and a buffer directly connected to a gate signal line, wherein each of them is divided into three connected in parallel.

Figure 1:
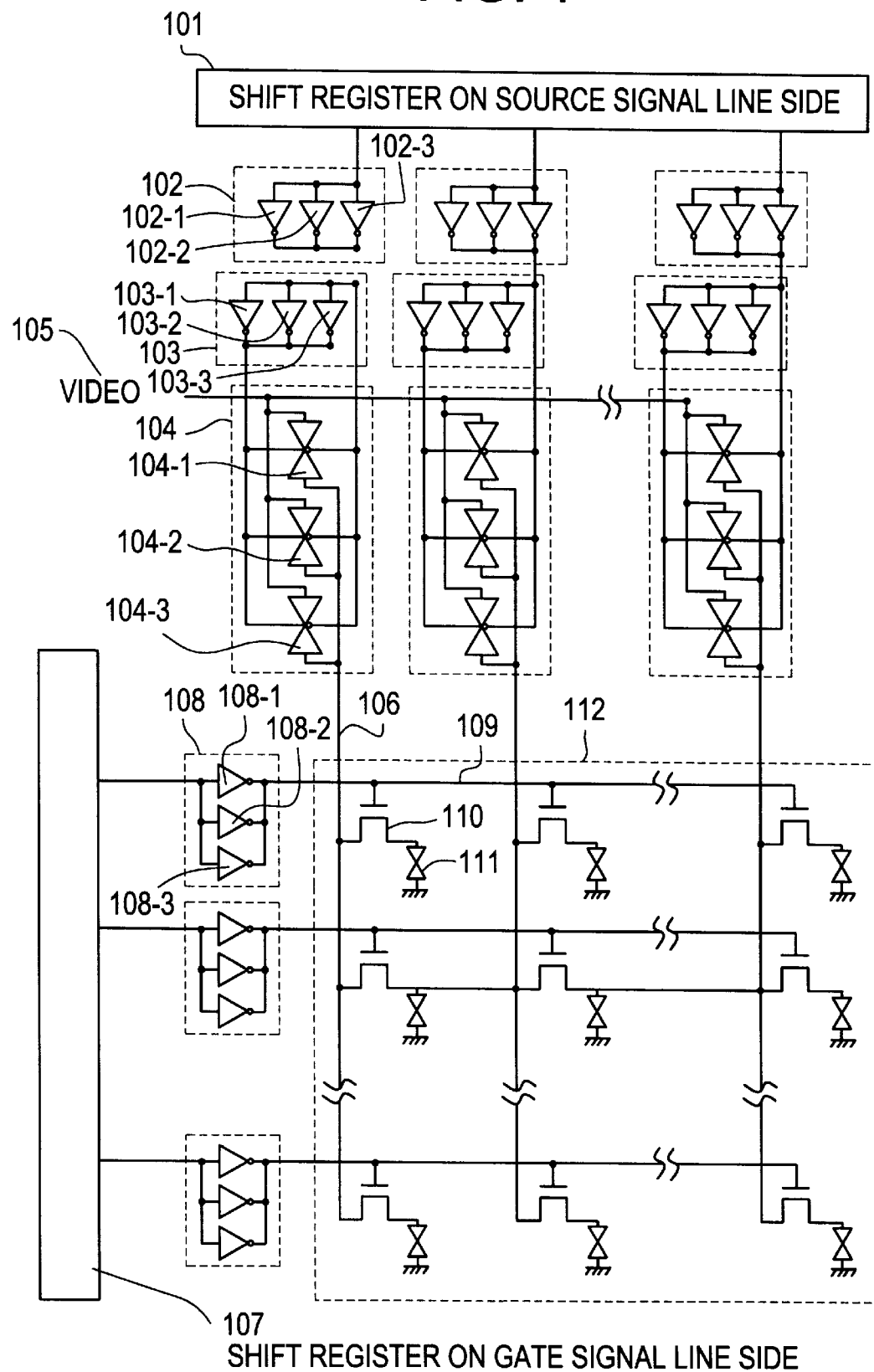
FIG. 1 is a schematic configuration diagram of an active matrix liquid crystal display device of the present invention.

Reference is now made to FIG. 1. 101 is a shift register provided on a side of source signal lines, 102 is a last staged buffer, 103 is a buffer for creating an inverted signal to a signal from the buffer 102, 104 is an analog switch, 105 is a video signal line, 106 is a source signal line, 107 is a shift register on a side of gate signal lines, 108 is a last staged buffer, 109 is a gate signal line (scan line), 110 is a pixel TFT, and 111 is a liquid crystal. Note that there are only shown, in FIG. 1, the analog switch 104 connected to the source signal line, last staged buffers 102 and 103, and the last staged buffer 108 directly connected to the gate signal line, with other circuits omitted for the sake of explanatory convenience. However, other circuits may be provided as required. The active matrix liquid crystal display device in this embodiment has pixels in number of 640 in horizontal× 480 in vertical×RGB.

The active matrix liquid crystal display device in this embodiment has a source signal line side drive circuit having the last staged buffers 102, 103 each configured by three buffers 102-1–102-3, 103-1–103-3 connected in parallel. The three buffers 102-1–102-3 are formed by respective TFTs each having a channel width of approximately 100 $\mu$m. Accordingly, the last staged buffer 102 is secured with a capacitance equivalent to that constituted by one TFT with a channel width of approximately 300 $\mu$m. This is true for the last staged buffer 103.

Meanwhile the analog switch 104 is constituted by three analog switches 104-1–104-3 connected in parallel. The three analog switches 104-1–104-3 are formed by respective TFTs each having a channel width of approximately 170 $\mu$m. Accordingly, the analog switch 104 is secured with a capacitance equivalent to that of one TFT with a channel width of approximately 510 $\mu$m.

Similarly, in a gate signal line side drive circuit, the last staged buffer 108 is configured by three buffers 108-1–108-3 connected in parallel. The three buffers 108-1–108-3 are formed by respective TFTs each having a channel width of approximately 170 $\mu$m. Accordingly, the last staged buffer 108 is secured with a capacitance equivalent to that constituted by one TFT with a channel width of approximately 510 $\mu$m.

Figure 2A:
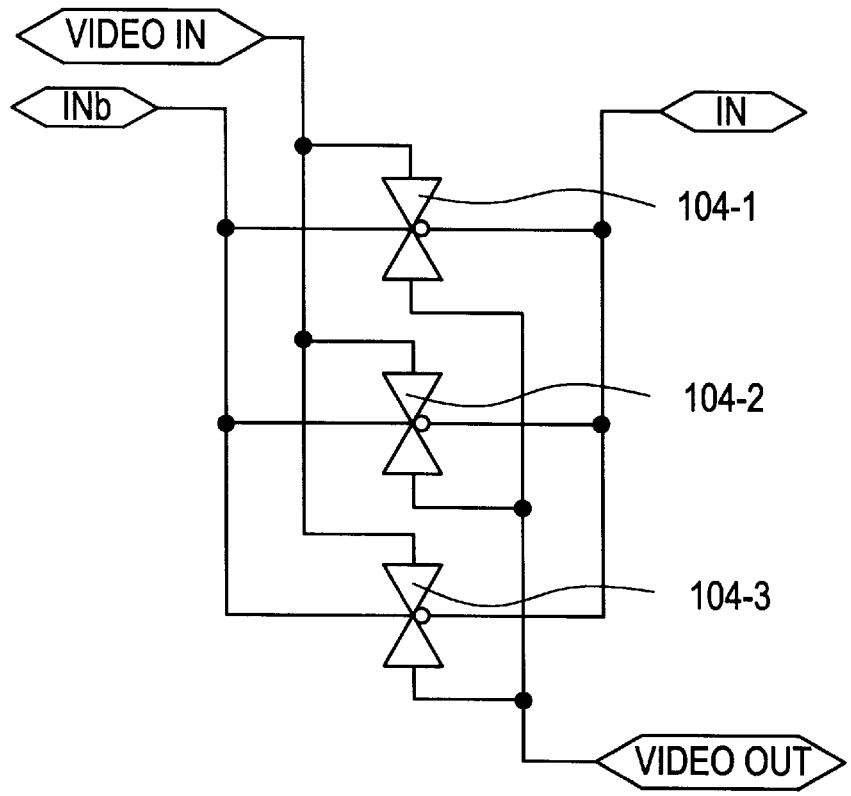
FIGS. 2(a) and 2(b) are circuit diagrams of an analog switch of the active matrix liquid crystal display device of the present invention.
Figure 2B:
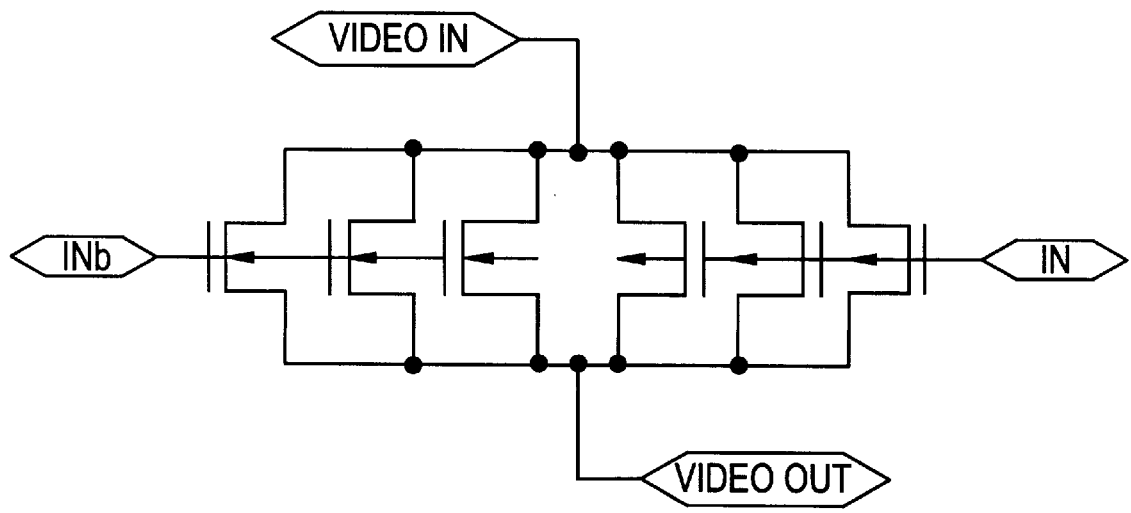

Now a circuit diagram for the analog switch 104 is shown in FIG. 2. FIG. 2(a) is a circuit diagram for the analog switch 104 wherein IN represents signal input from the buffer 102 while INb represents inputting an inverted signal (signal from the buffer 103) thereto. A video signal supplied from the video signal line is inputted through a VIDEO IN, while the video signal is outputted onto the source signal line through VIDEO OUT.

FIG. 2(*b*) shows a circuit diagram of the analog switch 104 configured by TFTs. The analog switch 104 is formed by the three analog switched 104-1–104-3, as stated above. The analog switches 104-1–104-3 are each formed by one N-channel TFT and one P-channel TFT connected in parallel therewith. Note that these three analog switches 104-1–104-3 are shown common in their inputs (IN, INb, VIDEO IN) and outputs (VIDEO OUT).

Figure 3A:
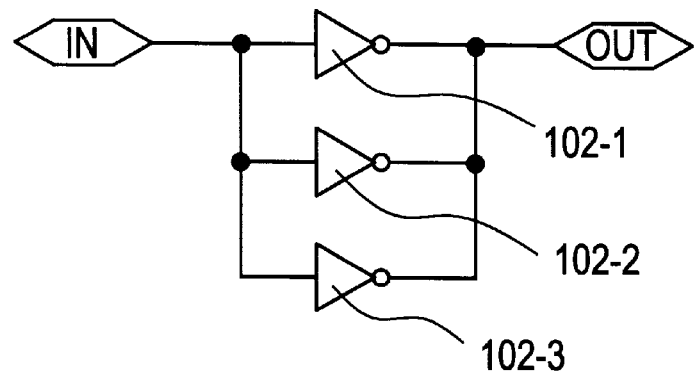
FIGS. 3(a) and 3(b) show circuit diagrams of a last staged buffer of the active matrix liquid crystal display device of the present invention.
Figure 3B:
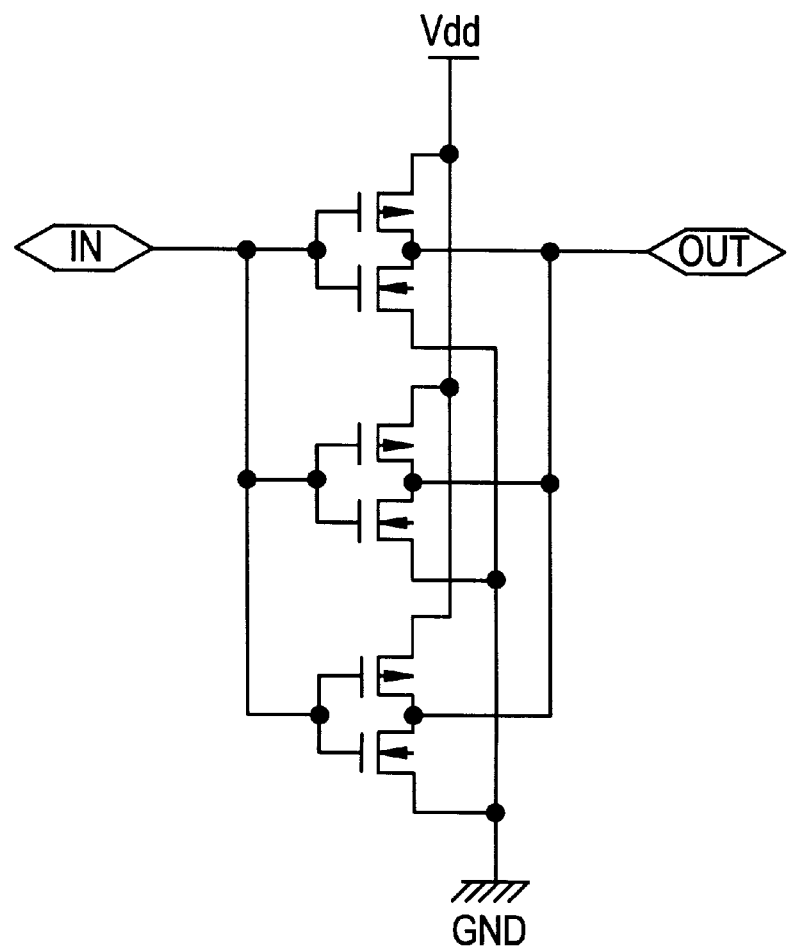

Reference will now be made to FIG. 3. FIGS. 3(*a*) and 3(*b*) show circuit diagrams for the buffer 102. In FIGS. 3(*a*) and 3(*b*) IN represents timing signal input from the shift register while OUT represents outputting an inverted signal thereto. Vdd is a constant power voltage. The buffer 102 is formed by three buffers 102-1–102-3 connected in parallel, as shown in FIG. 3(*a*). On the other hand, FIG. 3(*b*) shows a circuit diagram wherein the buffer 102 of FIG. 3(*a*) is formed by TFTs. It will be understood that a same input signal is inputted to any of gate electrodes of the TFTs constituting the buffer 102.

Figure 4:
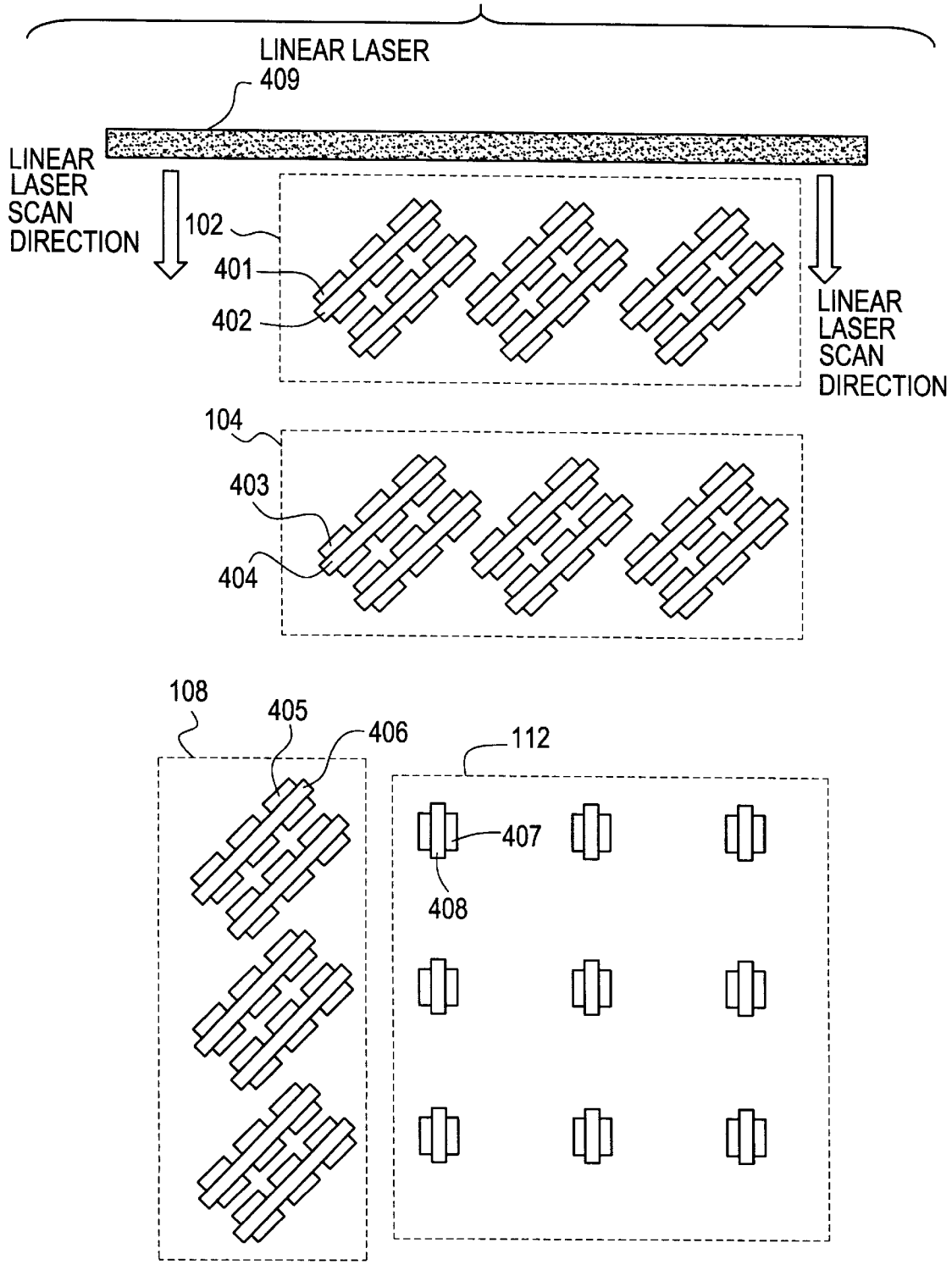
FIG. 4 is a view showing a relative position of TFTs and a linear laser of the active matrix liquid crystal display device of the present invention.

The arrangement of TFTs will now be explained which constitute the active matrix liquid crystal display device of the present embodiment. Reference is made to FIG. 4. FIG. 4 is a typical view depicting an arrangement of TFTs for the active matrix liquid crystal display device of FIG. 1.

In FIG. 4, 401 and 402 respectively represent an active layer and a gate electrode of a TFT constituting for the buffer 102. Although the buffer 103 is omittedly shown herein, it is structured similar to the buffer 102. 403 and 404 are respectively an active layer and a gate electrode of a TFT constituting for the analog switch 104. 405 and 406 respectively denote an active layer and a gate electrode of a TFT constituting for the buffer 108. 407 and 408 respectively represent an active layer and a gate electrode of a TFT constituting for a pixel matrix circuit 112. Incidentally, 409 typically depicts a form of a linear laser applied when the active layer is crystallized (subjected to laser anneal). In the figure, a linear laser scan direction is shown by an arrow.

Note that, although in FIG. 4 the TFTs are depicted in a patterned form with gate electrodes for convenience of explanation, the active layer when crystallized is not patterned different from that of FIG. 4. Also, the gate electrodes have not formed. That is, the patterning of the active layer and the formation of the gate electrodes are carried out after crystallization.

It is understood in FIG. 4 that the active layer arrangement of TFTs forming the buffer 102, the analog switch 104 and the buffer 108, i.e., the direction of carrier movement, is oblique relative to a direction of linear laser 409 scan or a direction perpendicular to a line (approximately 0.45 degrees in this embodiment). This arrangement can reduce variation in the TFTs. It is therefore possible to provide the buffers 102 and 103, the analog switch 104 and the buffer 108 by a plurality of TFTs with a short channel width, minimizing the variation.

It is understood that the active layers of the TFTs constituting the pixel matrix circuit 112, i.e., carrier movement, are arranged in direction relative to a direction of the linear laser beam 409 or a direction rectangular to the line. Note that the TFTs constituting other circuits, not shown in FIG. 4, are also arranged in direction similarly to the TFTs constituting the pixel matrix circuit 112. However, if a problem is raised in variation in those circuit's TFTs, the TFT active layers, i.e., the carrier movement, may be arranged oblique in direction relative to the direction of the linear laser beam 409 or the rectangular direction to the line (approximately 45 degrees in this embodiment), as in the buffer 102 and the analog switch 104.

In the present embodiment, the last staged buffers 102 and 103 of the source signal line drive circuit are formed by respective three buffers 102-1–102-3 and 103-1–103-3. The analog switch 104 is formed by three analog switches 104-1–104-3. Due to this, if compared with a case that the buffers 102 and 103 are formed by respective one buffer circuits, the TFTs constituting them can be made one-thirds in size (channel width). Accordingly, it is possible to reduce TFT's self heat generation and prevent change or degradation in TFT threshold values due to such self heat generation. Furthermore, if one or two of the three buffers constituting the last staged buffer should become inoperative, the remaining two or one buffer can operate. This is true for the analog switch 104.

It is known that as the TFT size (channel width) increases the variation tends to readily occur. It is also known that if the TFT size (channel width) is excessively large the TFT might not function as a channel at its end portion despite functioning as a channel at its center portion. It is known that in such a case there is concentration of carrier movement at the TFT center portion thereby accelerating TFT deterioration.

In the present embodiment, however, the analog switch and buffers by which image quality is directly affected are constituted by a plurality of TFTs with a short channel width with capacitance secured. Due to this, the variation can be decreased, the self heat generation be reduced, the reliability be improved and the deterioration be lessened.

On the other hand, in the source signal line drive circuit there often encounters a problem of characteristic variation in the analog switch for supplying image signals onto the source signal line. In such a case, the direction of carrier movement in the TFTs constituting the last staged buffers 102 and 103 may be given in parallel with the linear laser scan direction, as in the pixel matrix circuit of the present embodiment.

Figure 5:
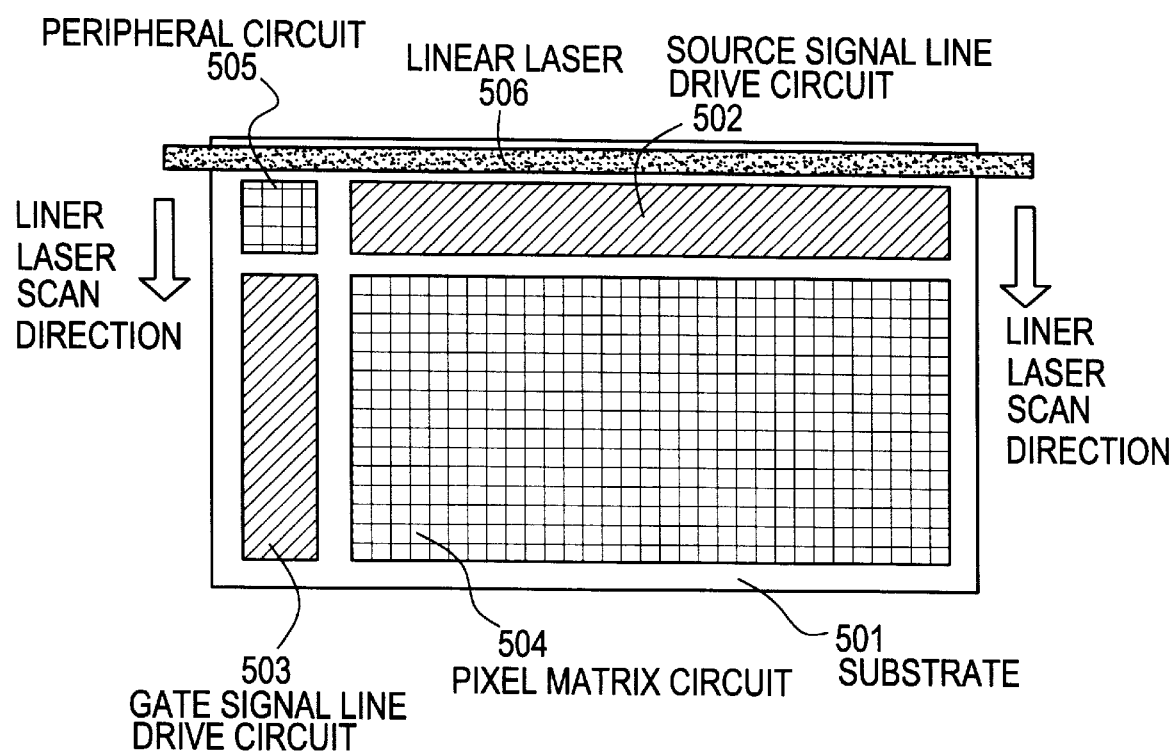
FIG. 5 is an overall view of an active matrix substrate of the active matrix liquid crystal display device of the present invention.

Reference is now made to FIG. 5. FIG. 5 illustrates an entire active matrix substrate for an active matrix liquid crystal display device according to the present embodiment. 501 denotes a substrate, 502 a source signal line drive circuit having a shift register, buffer, analog switch and etc., 503 a gate signal line drive circuit having a shift register, buffer and etc., 504 a pixel matrix circuit, and 505 a peripheral circuit having other logic circuits (LCD controller, memory and so on). 506 represents a linear laser form. Incidentally, in the figure a direction of scanning a linear laser is shown by an arrow.

Figure 6:
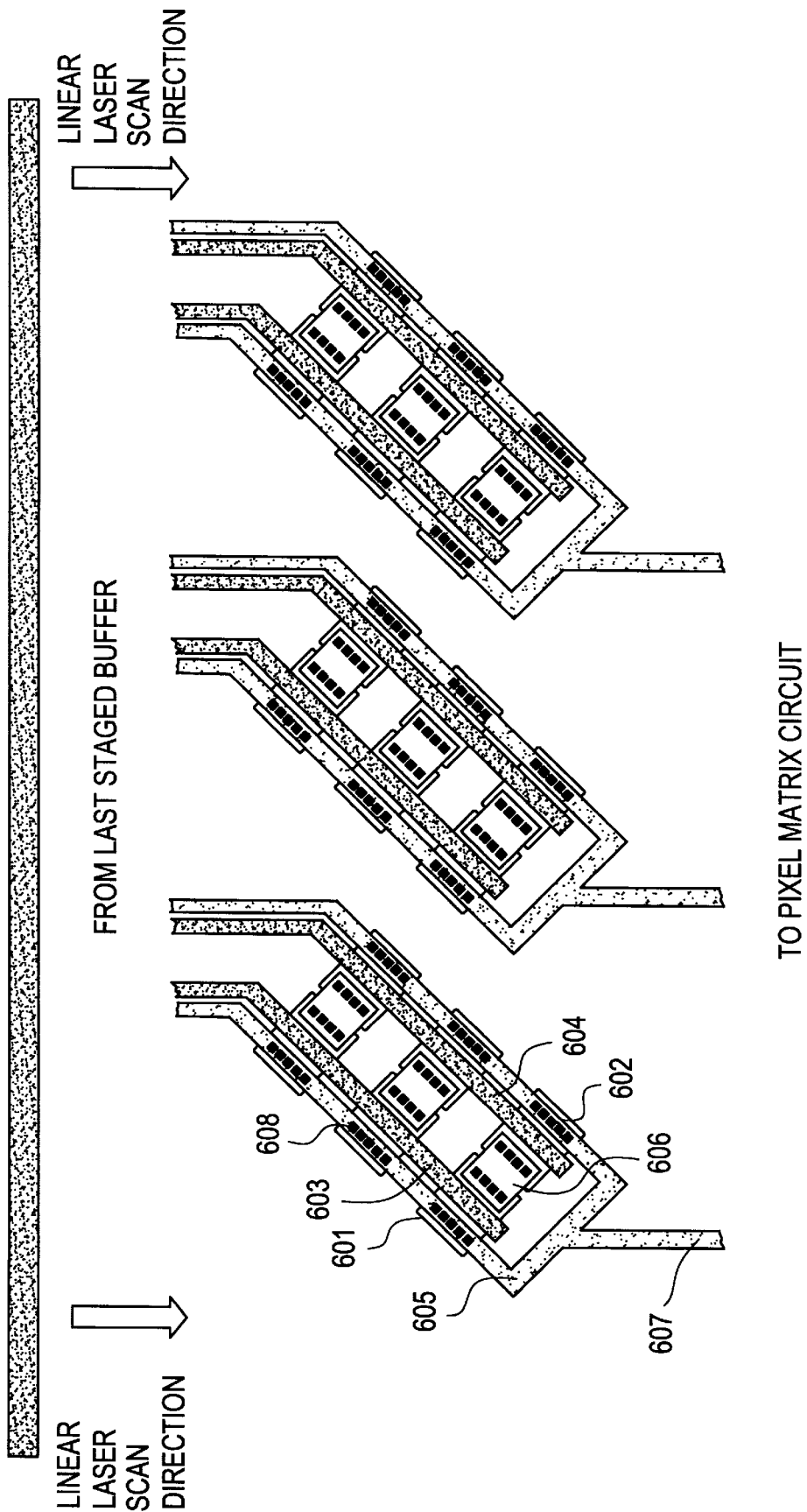
FIG. 6 is a circuit pattern view of the analog switch of the active matrix liquid crystal display device of the present invention.

Reference is now made to FIG. 6. In FIG. 6 there is illustrated a circuit pattern view of the analog switch 104. 601 and 602 are semiconductor active layers (silicon layers) which are respectively ion implanted such that the source/drain regions are made into N-channel type and P-channel type. 603 and 604 are gate electrodes, which in this embodiment use aluminum. Note that 603 and 604 can employ silicon. 605 and 606 denote 605 and 606 shows a second interconnection, which in this embodiment use aluminum. 607 is a source signal line. Blacked portions designated at 608 represents contacts provided between the second interconnection and the semiconductor active layer through a contact hole in an insulation film.

Incidentally, a linear laser form is typically shown for a convenient sake in order to facilitate understanding a direction of laser scan upon laser anneal and relative positions of a plurality of TFTs forming the analog switch.

In this embodiment arrangement is made as stated before such that the linear laser scan direction is oblique with respect to a direction of active layers or carrier movement (in 45 degrees in this embodiment). However, the arrangement if obliquely given is satisfactory, and is not limited to the above.

Because in the source signal line drive circuit there is particularly a problem of variation in the analog switch 104, only the TFTs forming the analog switch 104 may be arranged oblique with respect to the linear laser scan direction as in the present embodiment, and the TFTs forming the buffer 102 be arranged in parallel to the linear laser scan direction.

Note that a known manufacture process may be applied for the active matrix liquid crystal display device of the present embodiment. For example, such a method is concretely described in Japanese Patent Laying-open No. H8-172049 filed by the present applicant.

The manufacture process and a laser using is briefly explained hereinbelow.

First an amorphous silicon film formed on a glass substrate is crystallized. In the present embodiment, the crystallinity is enhanced by further irradiating a linear laser light to the crystalline silicon film that has been crystallized by heat application.

A KrF excimer laser (a wavelength of 248 nm, a pulse width of 30 ns) was employed in manufacturing an active matrix liquid crystal display device of the present embodiment. It is of course possible to use other excimer lasers or other schemed lasers.

The laser light is oscillated by an oscillator and passed through a total-reflection mirror to an amplifier where it is amplified. It is then introduced into an optical system through a total-reflection mirror.

The laser light immediately before incoming to the optical system is in a rectangular form of approximately 3×2 cm². By passing this laser light through the optical system, it is possible to obtain a thin-formed beam (linear beam) having a length of approximately 10–30 cm and a width of 0.1–1 cm. The laser light passed through the optical system possesses an energy of approximately 1000 J/shot at maximum.

If the laser beam thus controlled is irradiated to the substrate formed with a semiconductor thin film while moving the substrate in one direction, laser light irradiation can be made over the entire substrate. The stage on which the substrate is positioned for laser light irradiation is under computer control, which is designed to move at a required speed in a direction rectangular to the linear laser light. The semiconductor thin film is crystallized in this manner.

In this embodiment, the last staged buffer and analog switch are each three parallel-connected circuits formed by TFTs with a short channel width thereby preventing variation in characteristics. However, they are not limited to this. That is, the last staged buffer on the source signal line side may be constituted by parallel-connected buffers in number of x having a short channel width. Also, the analog switch on the source signal line side may be constituted by parallel-connected analog switches in number of y formed by TFTs with a short channel width. Further, the buffer on the gate signal line side may be constituted by parallel-connected buffers in number of z formed by TFTs with a short channel width. In such cases, the variation in characteristics is reduced furthermore.

As the number of pixels increases, the capacitance required for the buffer and the analog switch varies. Depending on this, the buffer and the analog switch differ as to how many small buffers and analog switches are to be employed to structure them.

EMBODIMENT 2

The active matrix liquid crystal display device of the present invention stated in Embodiment 1 is fully cope with as an active matrix liquid crystal display device with high precision and resolution. The number of pixels is great enough to cope with a future ATV (Advanced TV). It is therefore possible to cope with an active matrix liquid crystal display device with a resolution higher than XGA, e.g., 1920 in horizontal×1280 in vertical.

EMBODIMENT 3

The active matrix liquid crystal display devices as stated in the above embodiments 1 and 2 are applicable as a transparent type active matrix liquid crystal display and as a reflective type active matrix liquid crystal display device. Meanwhile, the liquid crystal material can use an antiferroelectric liquid crystal having no threshold. Also, the liquid crystal material can use a ferroelectric liquid crystal. This can cope with a case where the memory effect of the ferroelectric liquid crystal is erased by an especial orientation film or the like.

Explanations were made in the above embodiments 1 and 2 for the case that the liquid crystal is used as a display medium. However, these structures may be applied for any other semiconductor display device having a display medium having an optical characteristic to be modulated responsive to voltage application. For example, an electroluminescence element or electrochromics element may be used as a display medium.

The TFTs employed for the embodiment 1 and 2 may be of a top gate type or reverse stager type.

EMBODIMENT 4

The semiconductor display devices of Embodiments 1–3 described above have a variety of applications. In this embodiment a semiconductor device built with an active matrix semiconductor display device of the present invention.

Such semiconductor devices include video cameras, still cameras, projectors, head-mount displays, automobile navigators, personal computers, portable information terminals (mobile computers, handy phones, etc.) and so on. Examples of them are demonstrated in FIG. 7.

Figure 7A:
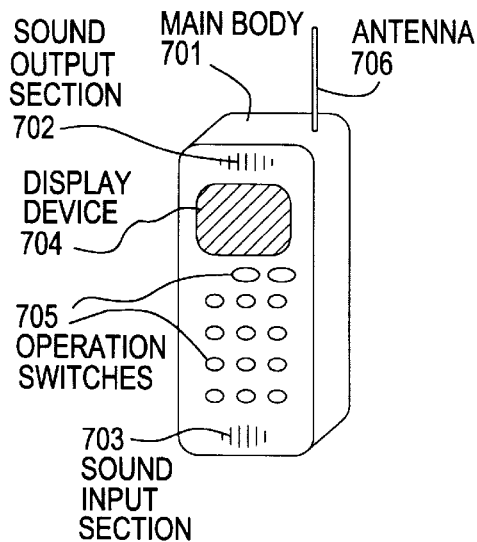
FIGS. 7(A) to 7(F) are examples of semiconductor devices built with the active matrix liquid crystal display device of the present invention.

FIG. 7(A) is a handy phone, which is structured by a main body 701, a sound an output section 702, a sound input section 703, a semiconductor display device 704, an operation switch 705 and an antenna 706.

Figure 7B:
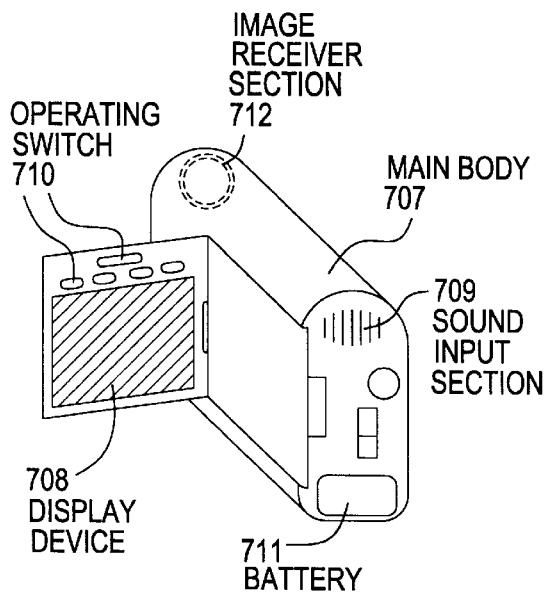

FIG. 7(B) is a video camera structured by a main body 707, a semiconductor display device 708, a sound input section 709, an operation switch 710, a battery 711 and a picture receiving section 712.

Figure 7C:
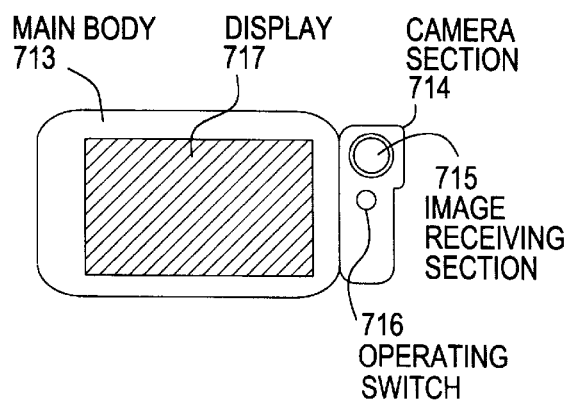

FIG. 7(C) is a mobile computer structured by a main body 713, a camera section 714, a picture receiving section 715, an operation switch 716 and a semiconductor display device 717.

Figure 7D:
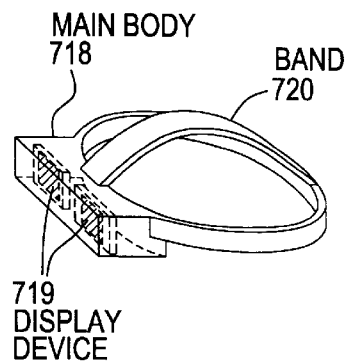

FIG. 7(D) is a head-mount display structured by a main body 718, a semiconductor display device 719 and a band section 720.

Figure 7E:
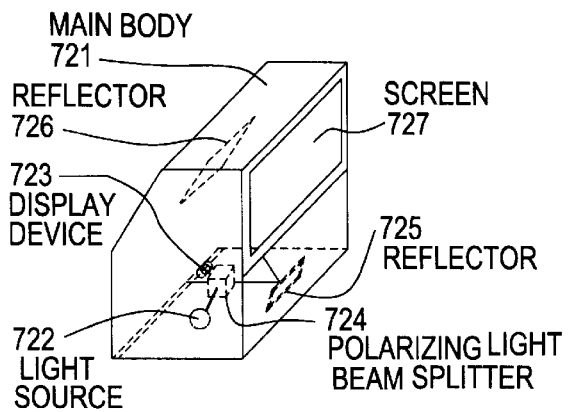

FIG. 7(E) is a rear type projector, wherein 721 is a main body, 722 a light source, 723 a semiconductor display device, 724 a polarizing beam splitter, 725 and 726 reflectors and 727 a screen. Note that the rear type projector preferably has a screen angle to be varied by a position of a viewer with the main body fixed. A rear type projector with increased resolution and precision is realized by using three semiconductor display devices 723 (corresponding to R, G, B light portions).

Figure 7F:
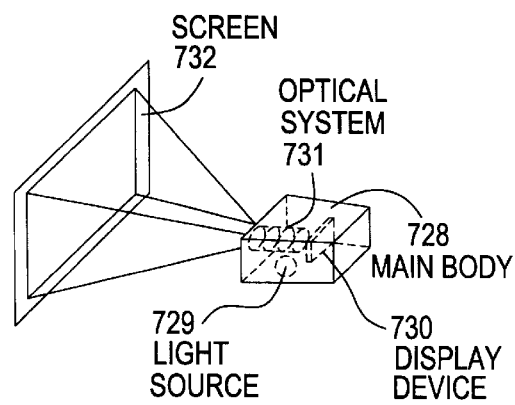
Figure 8:
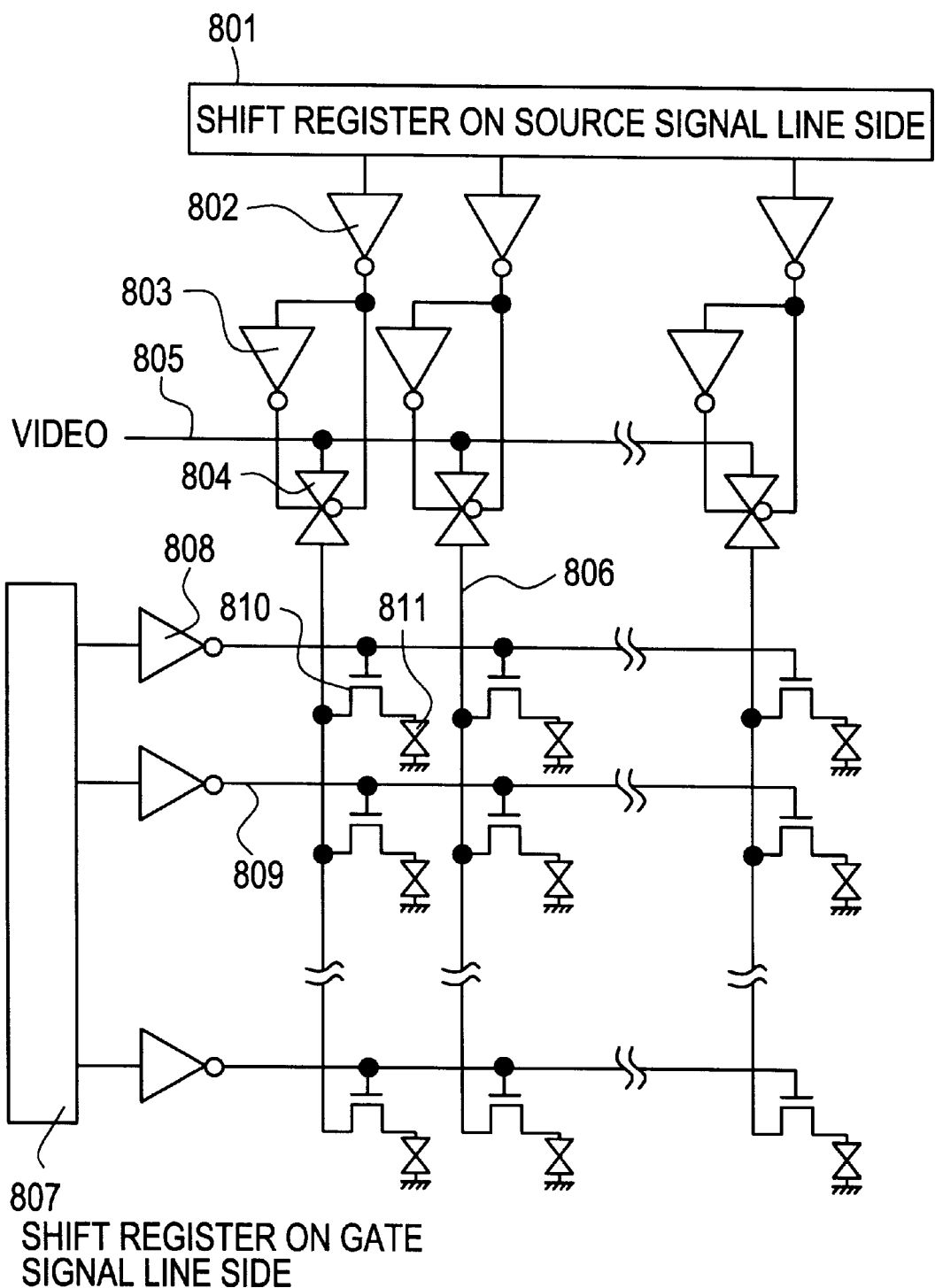
FIG. 8 is a schematic configuration diagram of a conventional active matrix liquid crystal display device.
Figure 9A:
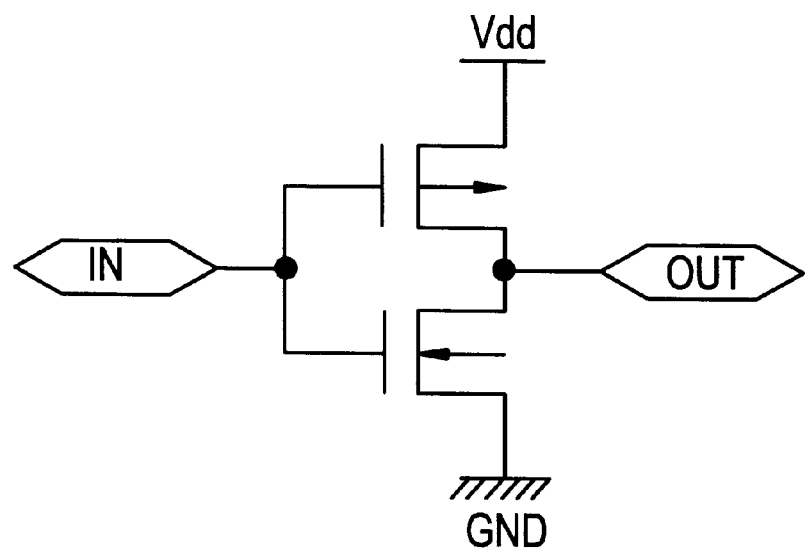
FIGS. 9(a) and 9(b) are circuit diagrams of a buffer and an analog switch.
Figure 9B:
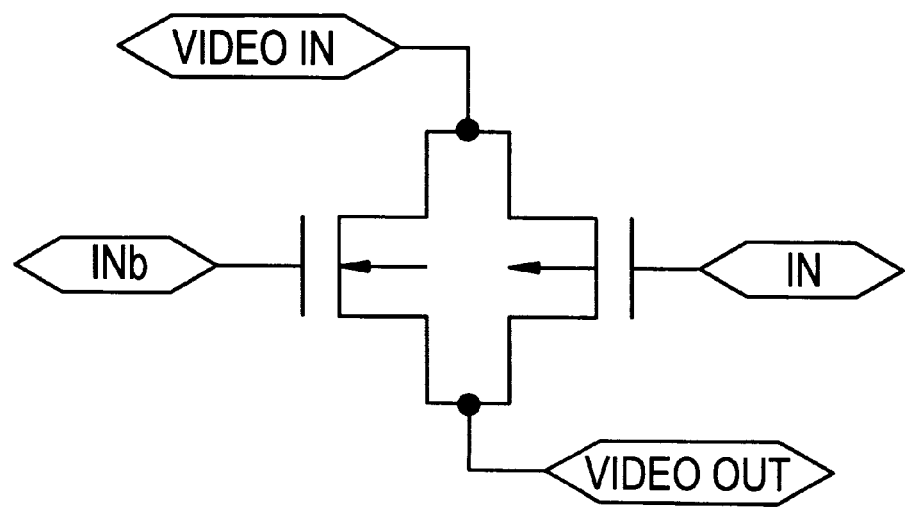

FIG. 7(F) is a front type projector, which is structured by a main body 728, a light source 729, a semiconductor display device 730, an optical system 731 and a screen 732. A front type projector with increased resolution and precision is realized by using three semiconductor display devices 730 (corresponding to R, G, B light portions).

According to the present invention, a high-quality active matrix semiconductor display device is realized which minimizes a characteristic variation, such as of analog switches, buffers, etc., as one of major causes of picture unevenness encountered in active matrix semiconductor display devices.

What is claimed is:

1. A semiconductor display device comprising:

a pixel matrix circuit;

a source signal line drive circuit, and a gate signal line drive circuit, wherein said source signal line drive circuit having a buffer and an analog switch, said analog switch being directly connected to a source signal line, said buffer being formed by buffers in number of x (x is an integer greater than 2) connected in parallel, said analog switch being formed by analog switches in number y (y is an integer greater than 2);

said gate signal line drive circuit having a buffer directly connected to a gate signal line, said buffer being formed by buffers in number z (z is an integer greater than 2 connected in parallel;

said pixel matrix circuit, said source signal line drive circuit, and said gate signal line drive circuit being formed by a plurality of TFTs using silicon films;

said silicon films being crystallized by scanning a linear laser; and said plurality of TFTs forming said analog switch and said buffers have a carrier moving direction oblique relative to a scanning direction of the linear laser.

2. A device according to claim 1, wherein the carrier moving direction of said TFTs is approximately at 45 degrees with respect to the linear laser scanning direction.

3. A semiconductor display device comprising:

a pixel matrix circuit;

a source signal line drive circuit, and a gate signal line drive circuit, wherein said source signal line drive circuit having an analog switch directly connected to a source signal line, said analog switch being formed by analog switches in number y (y is an integer greater than 2) connected in parallel;

said gate signal line drive circuit having a buffer directly connected to a gate signal line, said buffer being formed by buffers in number z (z is an integer greater than 2) connected in parallel;

said pixel matrix circuit, said source signal line drive circuit, and said gate signal line drive circuit being formed by a plurality of TFTs using silicon films;

said silicon films being crystallized by scanning a linear laser; and said plurality of TFTs forming said analog switch and said buffer have a carrier moving direction oblique relative to a scanning direction of the linear laser.

4. A device according to claim 3, wherein the carrier moving direction of said TFTs is approximately at 45 degrees with respect to the linear laser scanning direction.

5. A semiconductor display device comprising:

a pixel matrix circuit;

a source signal line drive circuit, and a gate signal line drive circuit, wherein said source signal line drive circuit having a buffer and an analog switch, said analog switch being directly connected to a source signal line, said buffer being formed by buffers in number of x (x is an integer greater than 2) connected in parallel, said analog switch being formed by analog switches in number y (y is an integer greater than 2) connected in parallel;

said gate signal line drive circuit having a buffer directly connected to a gate signal line, said buffer being formed by buffers in number z (z is an integer greater than 2) connected in parallel;

said pixel matrix circuit, said source signal line drive circuit, and said gate signal line drive circuit being formed by a plurality of TFTs using silicon films; and said plurality of TFTs forming said analog switch and said buffers have a carrier moving direction oblique relative to a row direction and column direction of said pixel matrix circuit.

6. A device according to claim 5, wherein the carrier moving direction of said TFTs is approximately at 45 degrees with respect to the row direction and column direction of said pixel matrix circuit.

* * * * *